(12) United States Patent
Khan et al.

(10) Patent No.: US 8,823,144 B2
(45) Date of Patent: Sep. 2, 2014

(54) SEMICONDUCTOR PACKAGE WITH INTERFACE SUBSTRATE HAVING INTERPOSER

(71) Applicant: Broadcom Corporation, Irvine, CA (US)

(72) Inventors: Rezaur Rahman Khan, Rancho Santa Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/052,466

(22) Filed: Oct. 11, 2013

(65) Prior Publication Data

US 2014/0035163 A1    Feb. 6, 2014

Related U.S. Application Data

(63) Continuation of application No. 13/401,457, filed on Feb. 21, 2012, now Pat. No. 8,558,395.

(51) Int. Cl.
*H01L 29/40* (2006.01)
*H01L 23/02* (2006.01)
*H01L 23/48* (2006.01)
*H01L 23/52* (2006.01)

(52) U.S. Cl.
USPC ........... 257/621; 257/686; 257/777; 257/778; 257/E21.597; 257/E23.011; 257/E23.085; 257/E23.174

(58) Field of Classification Search
USPC .................. 257/621, 686, 777, 778, E21.597, 257/E23.011, E23.085, E23.174
See application file for complete search history.

(56) References Cited

U.S. PATENT DOCUMENTS

| 5,198,963 | A |  | 3/1993 | Gupta et al. |
| 6,002,168 | A |  | 12/1999 | Bellaar et al. |
| 6,188,578 | B1 |  | 2/2001 | Lin et al. |
| 6,461,895 | B1 |  | 10/2002 | Liang et al. |
| 6,709,898 | B1 |  | 3/2004 | Ma et al. |
| 6,743,661 | B1 |  | 6/2004 | Drewery |
| 6,791,195 | B2 |  | 9/2004 | Urushima |
| 6,952,049 | B1 | * | 10/2005 | Ogawa et al. .................. 257/700 |
| 7,220,667 | B2 |  | 5/2007 | Yamagata |
| 7,262,615 | B2 | * | 8/2007 | Cheng et al. .............. 324/756.05 |
| 7,402,901 | B2 | * | 7/2008 | Hatano et al. .................. 257/684 |

(Continued)

FOREIGN PATENT DOCUMENTS

| KR | 10-2011-0036249 | 4/2011 |
| WO | WO-2009/017758 A2 | 2/2009 |

*Primary Examiner* — Ida M Soward
(74) *Attorney, Agent, or Firm* — McDermott Will & Emery LLP

(57) ABSTRACT

An interface substrate is disclosed which includes an interposer having through-semiconductor vias. An upper and a lower organic substrate are further built around the interposer. The disclosed interface substrate enables the continued use of low cost and widely deployed organic substrates for semiconductor packages while providing several advantages. The separation of the organic substrate into upper and lower substrates enables the cost effective matching of fabrication equipment. By providing an opening in one of the organic substrates, one or more semiconductor dies may be attached to exposed interconnect pads coupled to through-semiconductor vias of the interposer, enabling the use of flip chips with high-density microbump arrays and the accommodation of dies with varied bump pitches. By providing the opening specifically in the upper organic substrate, a package-on-package structure with optimized height may also be provided.

14 Claims, 9 Drawing Sheets

(56) References Cited

U.S. PATENT DOCUMENTS

| | | |
|---|---|---|
| 7,585,702 B1 | 9/2009 | Wang et al. |
| 7,675,163 B2 | 3/2010 | Heydari et al. |
| 7,834,450 B2 | 11/2010 | Kang |
| 7,838,337 B2 * | 11/2010 | Marimuthu et al. .......... 438/110 |
| 7,901,986 B2 | 3/2011 | Arai et al. |
| 8,008,125 B2 | 8/2011 | McConnelee et al. |
| 8,021,927 B2 * | 9/2011 | Khan et al. .................... 438/122 |
| 8,022,555 B2 | 9/2011 | Hwang et al. |
| 8,133,761 B2 | 3/2012 | Gerber et al. |
| 8,188,594 B2 * | 5/2012 | Ganesan et al. .............. 257/713 |
| 8,202,763 B2 | 6/2012 | Meyer et al. |
| 8,310,063 B2 | 11/2012 | Wang |
| 8,344,516 B2 | 1/2013 | Chainer |
| 8,461,672 B2 | 6/2013 | Haba et al. |
| 2002/0030261 A1 | 3/2002 | Rolda et al. |
| 2003/0036219 A1 | 2/2003 | Masumoto et al. |
| 2005/0218518 A1 | 10/2005 | Jiang et al. |
| 2005/0248015 A1 * | 11/2005 | Palanduz ...................... 257/684 |
| 2006/0145328 A1 | 7/2006 | Hsu |
| 2006/0186531 A1 | 8/2006 | Hsu |
| 2006/0186536 A1 | 8/2006 | Hsu |
| 2006/0220262 A1 | 10/2006 | Meyer et al. |
| 2006/0244470 A1 * | 11/2006 | Shinde et al. ................. 324/754 |
| 2006/0258044 A1 | 11/2006 | Meyer et al. |
| 2007/0132082 A1 | 6/2007 | Tang et al. |
| 2007/0209831 A1 | 9/2007 | Sakamoto et al. |
| 2007/0273049 A1 | 11/2007 | Khan et al. |
| 2007/0290376 A1 | 12/2007 | Zhao et al. |
| 2008/0044944 A1 | 2/2008 | Wakisaka et al. |
| 2008/0128882 A1 * | 6/2008 | Baek et al. .................... 257/686 |
| 2008/0157322 A1 | 7/2008 | Tang et al. |
| 2008/0157328 A1 | 7/2008 | Kawata |
| 2008/0246138 A1 | 10/2008 | Gerber et al. |
| 2008/0268638 A1 | 10/2008 | Dertinger et al. |
| 2009/0053858 A1 | 2/2009 | Ko et al. |
| 2009/0102030 A1 | 4/2009 | Khan et al. |
| 2009/0140415 A1 * | 6/2009 | Furuta .......................... 257/700 |
| 2010/0019360 A1 | 1/2010 | Khan et al. |
| 2010/0084754 A1 | 4/2010 | Yoo et al. |
| 2010/0133534 A1 | 6/2010 | Do et al. |
| 2010/0301474 A1 | 12/2010 | Yang |
| 2011/0024888 A1 * | 2/2011 | Pagaila et al. ................. 257/686 |
| 2011/0024906 A1 | 2/2011 | Meyer et al. |
| 2011/0241185 A1 | 10/2011 | Koester et al. |
| 2011/0254160 A1 * | 10/2011 | Tsai et al. ...................... 257/738 |
| 2011/0272819 A1 | 11/2011 | Park et al. |
| 2011/0278732 A1 | 11/2011 | Yu et al. |
| 2011/0285030 A1 | 11/2011 | Meyer et al. |
| 2012/0009738 A1 | 1/2012 | Crawford et al. |
| 2012/0018899 A1 | 1/2012 | Pagaila et al. |
| 2012/0062439 A1 | 3/2012 | Liao et al. |
| 2012/0139105 A1 | 6/2012 | Lin et al. |
| 2012/0152605 A1 | 6/2012 | Das et al. |
| 2012/0168942 A1 | 7/2012 | Gan et al. |
| 2012/0211885 A1 | 8/2012 | Choi et al. |
| 2012/0223429 A1 | 9/2012 | Khan et al. |
| 2012/0225522 A1 | 9/2012 | Zhao et al. |
| 2012/0228753 A1 | 9/2012 | Ko et al. |
| 2012/0241921 A1 | 9/2012 | Lee et al. |
| 2012/0292785 A1 * | 11/2012 | Pagaila et al. ................. 257/774 |
| 2012/0313240 A1 | 12/2012 | Cheng et al. |
| 2012/0319284 A1 * | 12/2012 | Ko et al. ........................ 257/773 |
| 2012/0319293 A1 | 12/2012 | Cheah et al. |
| 2013/0000968 A1 | 1/2013 | Zhao et al. |
| 2013/0062764 A1 | 3/2013 | Jin |
| 2013/0075917 A1 | 3/2013 | Law et al. |
| 2013/0113098 A1 | 5/2013 | Hwang et al. |
| 2013/0147023 A1 | 6/2013 | Lin et al. |
| 2013/0181354 A1 * | 7/2013 | Khan et al. .................... 257/774 |

* cited by examiner

US 8,823,144 B2

SEMICONDUCTOR PACKAGE WITH INTERFACE SUBSTRATE HAVING INTERPOSER

This is a continuation of application Ser. No. 13/401,457 filed Feb. 21, 2012, which is incorporated herein by reference in its entirety.

BACKGROUND

To interface bare semiconductor dies to a support surface such as a printed circuit board, there is a need for an appropriate package substrate or interposer to interface and route the semiconductor dies within a package, such as a ball grid array (BGA) package, chip scale package (CSP), or system-in-package (SiP), to the printed circuit board. Organic substrates such as Bismaleimide-Triazine (BT), Ajinomoto Build-up Film (ABF), FR-4 laminates, E679-FBG, ECL4785GS, and E700 are conventionally used with laminated conductor or build-up layers. With their long use in the industry, organic substrates provide a low cost and well-understood material for package substrates.

Despite their advantages, organic substrates have particular drawbacks for specific package requirements. The organic substrate must be built using fabrication technology according to stringent design rules, raising the cost of fabrication where multiple contact pad pitches are utilized. The use of organic substrates also impose limitations for the minimum size of interconnect trace line widths, line to line spacing, and contact pad pitch, hindering integration of dies with high density I/O arrays. While non-organic substrates such as low-temperature co-fired ceramic (LTCC) substrates can provide high-density wiring, organic substrates still offer substantial cost, availability, thinness, and process advantages.

SUMMARY

The present disclosure is directed to an organic interface substrate having interposer with through-semiconductor vias, substantially as shown in and/or described in connection with at least one of the figures, as set forth more completely in the claims.

DETAILED DESCRIPTION

Figure 1:
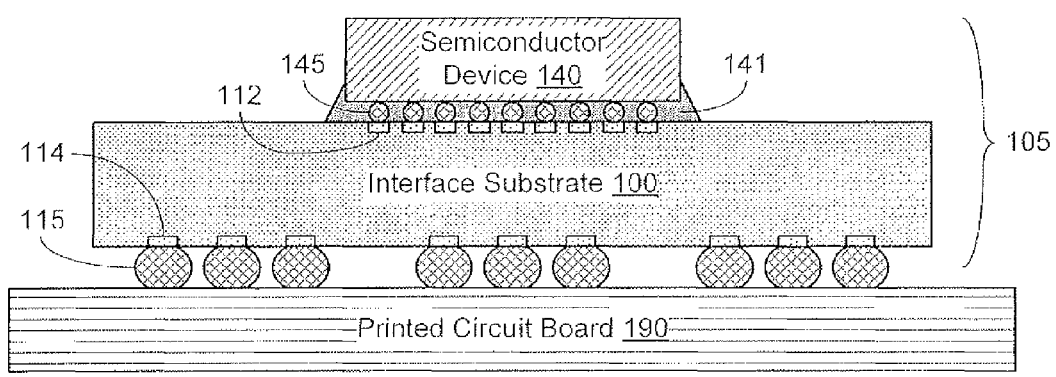
FIG. 1 presents a cross-sectional view of an exemplary package using a conventional organic interface substrate.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a cross-sectional view of an exemplary package using a conventional organic interface substrate. FIG. 1 includes package 105 (or "semiconductor package" 105) mounted on printed circuit board 190. Package 105 includes interface substrate 100 and semiconductor device 140. Interface substrate 100 includes a plurality of upper contact pads 112, with an exemplary upper contact pad 112 as shown. Interface substrate 100 also includes a plurality of lower contact pads 114, with an exemplary lower contact pad 114 as shown. The plurality of lower contact pads 114 are coupled to a respective plurality of solder balls 115, with an exemplary solder ball 115 as shown. Semiconductor device 140 includes a plurality of microbumps 145, with an exemplary microbump 145 as shown. The plurality of microbumps 145 are connected to a respective plurality of upper contact pacts 112. Underfill 141 is also placed below semiconductor device 140 to support and protect the plurality of microbumps 145 as well as the semiconductor device 140.

Interface substrate 100 may be a conventional multi-layer organic substrate, functioning as an interconnection chip carrier for I/O pads on semiconductor device 140 to be routed to printed circuit board 190 or another support surface. As discussed in the background, organic substrates present particular drawbacks for specific package requirements. Interconnect trace line widths and line-to-line spacing within interface substrate 100 are limited by the chemical etching or plating process to, for example, a minimum of 15 microns, in high volume manufacturing, preventing high density routing and high density interconnect contact pads. The minimum pitch of contact pads such as the plurality of upper contact pads 112 is also limited to, for example, around 150 microns in high volume manufacturing. Accordingly, high-density bump arrays cannot be utilized for the plurality of microbumps 145 on semiconductor device 140.

Moreover, since stringent design rules dictate the fabrication equipment required to create all the layers of interface substrate 100, costly high-density fabrication equipment is required even for low-density layers. For example, since the plurality of solder balls 115 are to be mated to an external support surface such as printed circuit board 190, the pitch between the plurality of lower contact pads 114 is permitted to be relatively large, for example 300 to 500 microns. However, to accommodate the pitch of the plurality of microbumps 145 on semiconductor device 140, the plurality of upper contact pads 112 may require a relatively denser pitch, for example 130 to 200 microns. Accordingly, the entire interface substrate 100 must be fabricated with equipment supporting contact pads with a pitch of, for example, 130 microns, increasing manufacturing costs.

Figure 2A:
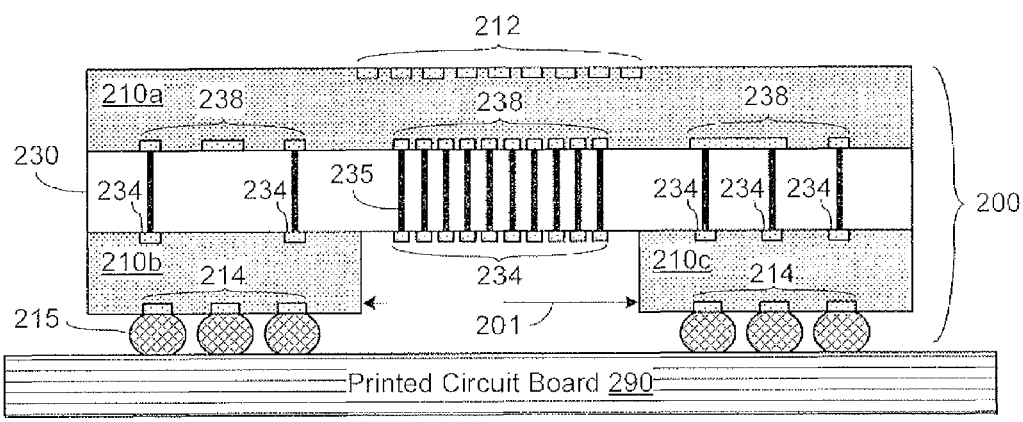
FIG. 2A presents a cross-sectional view of an exemplary organic interface substrate with through-semiconductor vias.

Turning to FIG. 2A, FIG. 2A presents a cross-sectional view of an exemplary organic interface substrate with through-semiconductor vias. FIG. 2A includes interface substrate 200 mounted on printed circuit board 290. Interface substrate 200 includes upper organic substrate 210a, an interposer 230, and lower organic substrate 210b and 210c. Upper organic substrate 210a includes a plurality of upper contact pads 212 and a plurality of upper interconnect pads 238. Interposer 230 includes a plurality of through-semiconductor vias (TSVs) 235, with an exemplary TSV 235 as shown. Lower organic substrate 210b and 210c both include a plurality of lower interconnect pacts 234 and a plurality of lower contact pads 214. The plurality of lower contact pads 214 are coupled to a respective plurality of solder balls 215, with an exemplary solder hall 215 as shown.

Upper organic substrate 210a and lower organic substrate 210b and 210c may each utilize organic materials such as Bismaleimide-Triazinc (BT), Ajinomoto Build-up Film (AFB), FR-4 laminates, E679-FBG, ECL4785GS, and E700. Upper organic substrate 210a may utilize the same materials as lower organic substrate 210b and 210c. Upper organic substrate 210a and lower organic substrate 210b and 210c may each include multiple conductive laminate or build-up layers for wiring, as known in the art.

A first plurality of the lower interconnect pads 234 within lower organic substrate 210b and 210c may be electrically connected to a respective first plurality of the upper interconnect pads 238 using a first plurality of the TSVs 235 to route the pads in any desired manner. An opening 201 divides the cross-section of the lower organic substrate into lower organic substrate 210b and 210c, and also exposes a second plurality of the lower interconnect pads 234, which may then be utilized as lower contact pads, for example to receive a lower semiconductor die. The second plurality of the lower interconnect pads 234 are also capable of electrical connection to a respective second plurality of the upper interconnect pads 238 using a second plurality of the TSVs 235.

Upper organic substrate 210a may include a plurality of upper contact pads 212 as shown, which are capable of electrical connection to the aforementioned first and second plurality of upper interconnect pads 238, for example through conductive wiring layers within upper organic substrate 210a, which are not specifically shown in FIG. 2A. The upper contact pacts 212 may also receive an upper semiconductor die, as discussed in conjunction with FIG. 2B below.

Interposer 230 may be a semiconductor material such as silicon. Thus, the plurality of TSVs 235 may be through-silicon vias. Since high density through-silicon vias may be utilized, interposer 230 may provide a much denser pad pitch for the plurality of upper interconnect pacts 238 and the plurality of lower interconnect pads 234. Thus, for example, the exposed second plurality of the lower interconnect pads 234 may have a pitch of, for example, 50 microns or less, such as, for example, 20 to 40 microns, allowing a lower semiconductor die with high density microbumps to be attached, as discussed in conjunction with FIG. 2C below. Accordingly, upper and lower semiconductor dies with different bump pitches and a lower semiconductor die with a high-density bump pitch less than, for example, 130 microns may be readily supported, in contrast to the conventional interface substrate 100 of FIG. 1.

Since upper organic substrate 210a and lower organic substrate 210b and 210c may be formed separately onto interposer 230, fabrication equipment may be matched to the requirements of each individual substrate. For example, the fabrication of upper organic substrate 210a may require equipment supporting a pact pitch of, for example, at least 130 microns for the plurality of upper contact pads 212, whereas the fabrication of lower organic substrate 210b and 210b may only require equipment supporting a pad pitch of for example, at least 300 microns for the plurality of lower contact pads 214. Accordingly, fabrication costs may be minimized compared to a conventional organic substrate, such as interface substrate 100 of FIG. 1, where stringent design rules dictate the required fabrication equipment for all layers of interface substrate 100.

Figure 2B:
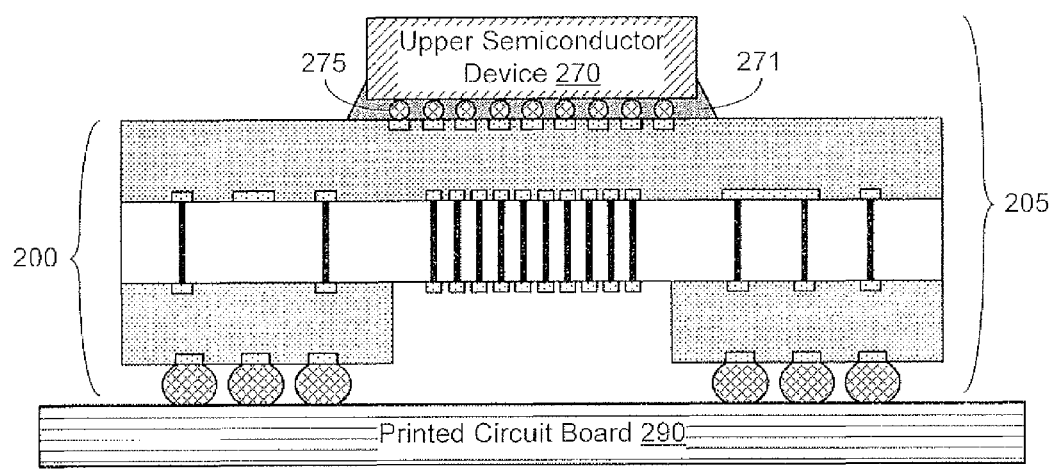
FIG. 2B presents a cross-sectional view of an exemplary package using an organic interlace substrate with through-semiconductor vias.

Next, FIG. 2B presents a cross-sectional view of an exemplary package using an organic interface substrate with through-semiconductor vias. Package 205 (or "semiconductor package" 205) of FIG. 2B includes interface substrate 200 and upper semiconductor device 270, and is mounted on printed circuit board 290. Upper semiconductor device 270 includes a plurality of microbumps 275, with an exemplary microbump 275 as shown. Underfill 271 is also placed below upper semiconductor device 270 to support and insulate the plurality of microbumps 275. With respect to FIG. 2B, interface substrate 200 may correspond to interface substrate 200 from FIG. 2A, as described above.

The upper organic substrate of interface substrate 200 in FIG. 2B includes a plurality of upper contact pads for receiving upper semiconductor device 270, which may be a flip-chip as shown. However, upper semiconductor device 270 may also include a wire-bonded die as well, in which case corresponding top contact pads or fingers for the wire bonds may be provided on the upper organic substrate of interface substrate 200. Furthermore, while only a single upper semiconductor device 270 is shown, alternative implementations may mount multiple semiconductor devices onto the top surface of interface substrate 200. Thus, package 205 may be a hybrid package including both flip-chip and wire-bonded dies. Heat sinks and/or mold compound may also be applied to package 205, which are not shown in FIG. 2B. Accordingly, package 205 may flexibly include one or more semiconductor dies for connecting to printed circuit board 290 through interface substrate 200.

Figure 2C:
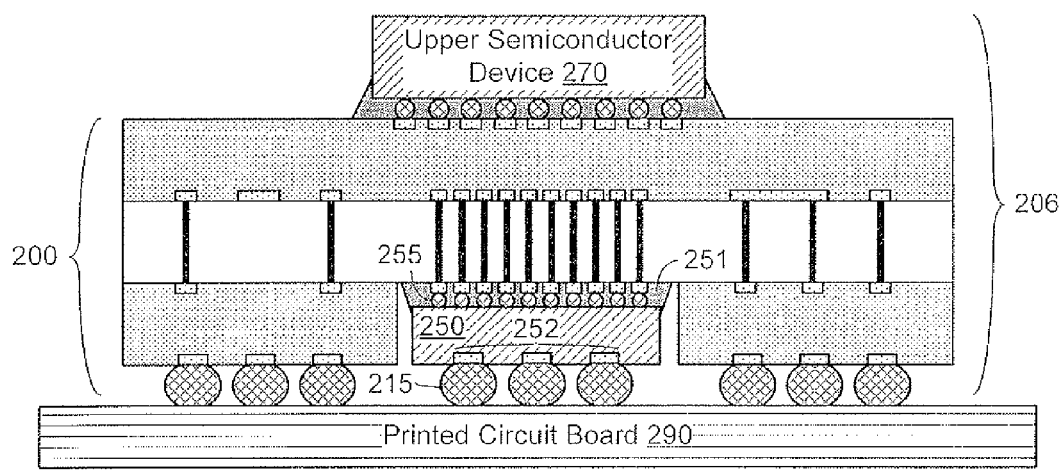
FIG. 2C presents a cross-sectional view of an exemplary multi-die package using an organic interlace substrate with through-semiconductor vias.

Continuing, FIG. 2C presents a cross-sectional view of an exemplary multi-die package using an organic interface substrate with through-semiconductor vias. Package 206 of FIG. 2C may correspond to package 205 of FIG. 2B with an addition of a lower semiconductor device 250. Lower semiconductor device 250 includes a plurality of microbumps 255, with an exemplary microbump 255 as shown. Underfill 251 is also placed below, or above after flipping, lower semiconductor device 250 to support and protect the plurality of microbumps 255. Additionally, the plurality of solder balls for connection to printed circuit board 290 may be extended to include additional solder balls, with an exemplary solder ball 215 as shown, connected to respective die contact pacts 252 of lower semiconductor device 250. While soldier balls 215 are all shown with uniform size in FIG. 2C, solder balls 215 connected to die contact pacts 252 and solder balls 215 connected to lower contact pads 214 may be different sizes. For example, lower semiconductor device 250 may extend beyond lower organic substrate 210b and 210c, thereby necessitating smaller solder balls 215 for die contact pads 252. Additionally, in some implementations, land grid arrays (LGAs) may be utilized instead of ball grid arrays (BGAs) as shown in FIG. 2C.

In some implementations, die contact pads 252 may be electrically inactive and provided for thermal dissipation only. Multiple semiconductor device dies may also be mounted onto the exposed bottom contact pads of interface substrate 200, rather than only a single lower semiconductor device 250 as shown in FIG. 2C. Heat sink/heat spreader and/or mold compound may also be integrated to package 206, which are not shown in FIG. 2C. As previously discussed, since the plurality of through-semiconductor vias in interface substrate 200 enable high-density contact pads having a pitch of for example, 20 to 40 microns, upper and lower semiconductor dies with different contact pad densities may be readily supported. Accordingly, package 206 may support multiple dies of different pitches, including high-density pitches, for connecting to printed circuit board 290 through interface substrate 200. For example, upper semiconductor device 270 may have a microbump pitch of for example, 130 to 300 microns, whereas lower semiconductor device 250 may have a microbump pitch of, for example, 20 to 40 microns. Moreover, package 206 may be constructed in a cost effective manner using well-known organic substrate fabrication techniques and fabrication equipment tailored individually to the pitch requirements of the separate upper and lower layers.

Figure 2D:
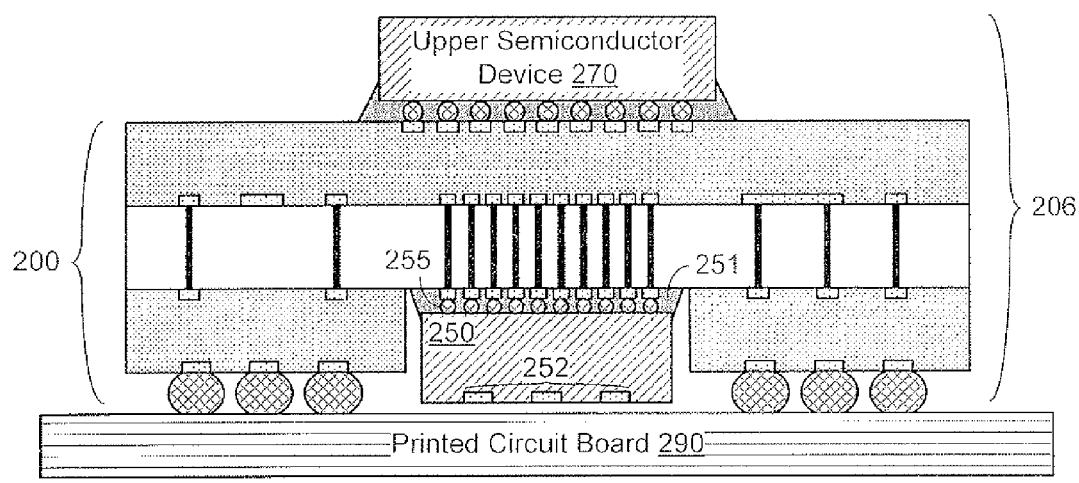
FIG. 2D presents a cross-sectional view of another exemplary multi-die package using an organic interface substrate with through-semiconductor vias.

FIG. 2D presents a cross-sectional view of another exemplary multi-die package using an organic interface substrate with through-semiconductor vias. With respect to FIG. 2D the difference from FIG. 2C is the decoupling of lower semiconductor device 250 from printed circuit board 290. Thus, as shown in FIG. 2D, the lower semiconductor device 250 may not necessarily connect to printed circuit board 290. Moreover, as previously discussed, lower semiconductor device 250 may extend beyond lower organic substrate 210b and 210c, as shown in FIG. 2D.

Figure 3A:
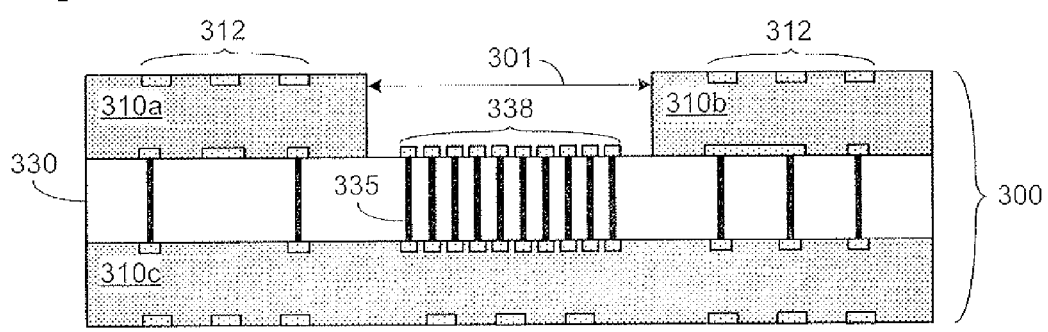
FIG. 3A presents a cross-sectional view of an exemplary organic interface substrate with through-semiconductor vias.

Turning to FIG. 3A, FIG. 3A presents a cross-sectional view of an exemplary organic interface substrate with through-semiconductor vias. Interface substrate 300 of FIG. 3A may correspond to interface substrate 200 of FIG. 2A, with the exception that the opening 201 is moved from the lower organic substrate to the upper organic substrate, resulting in an opening 301. Upper organic substrate 310a and 310b and lower organic substrate 310c are thereby provided, with an interposer 330 in-between.

As with interface substrate 200 in FIG. 2A, TSVs are provided within interposer 330 for routing between the various interconnect pads of interface substrate 300 in FIG. 3A. Thus, similar to interface substrate 200, a first plurality of lower interconnect pads within lower organic substrate 310c may be electrically connected to a respective first plurality of upper interconnect pads within upper organic substrate 310a and 310b using a first plurality of the TSVs 335 to route the pads in any desired manner. The opening 301 divides the cross-section of the upper organic substrate into upper organic substrate 310a and 310b, and also exposes a second plurality of the upper interconnect pads 338, as shown, which may then be utilized as upper contact pads, for example to receive an upper semiconductor die as discussed in conjunction with FIG. 3C below. A second plurality of lower interconnect pads in lower organic substrate 310c are also capable of electrical connection to a respective second plurality of the upper interconnect pads 338 using a second plurality of the TSVs 335.

Upper Organic substrate 310a and 310b may include a plurality of upper contact pads 312 as shown, which are capable of electrical connection to the aforementioned first and second plurality of upper interconnect pads 338, for example through conductive wiring layers within upper organic substrate 310a and 310b and lower organic substrate 310c, which are not specifically shown in FIG. 3A, and through TSVs 335. The upper contact pads 312 may also receive an upper package, as discussed in conjunction with FIG. 3D below.

Figure 3B:
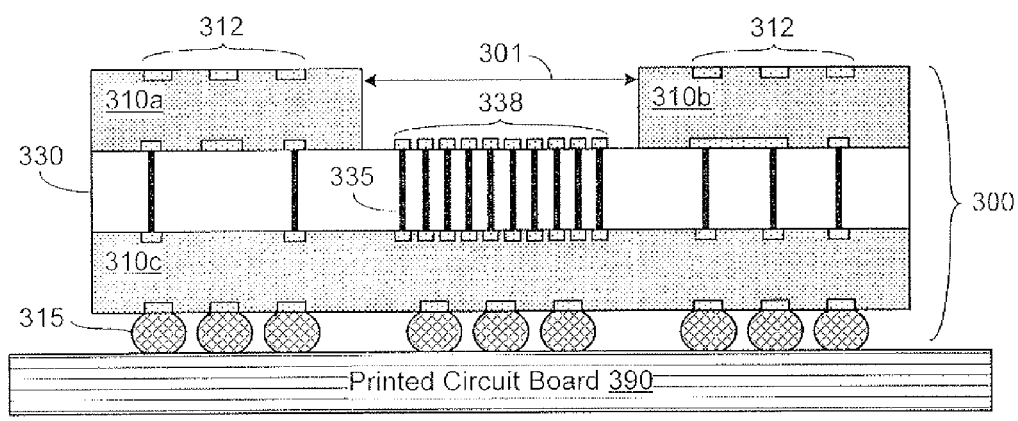
FIG. 3B presents a cross-sectional view of an exemplary organic interface substrate with through-semiconductor vias mounted on a support surface.

FIG. 3B presents a cross-sectional view of an exemplary organic interface substrate with through-semiconductor vias mounted on a support surface. Thus, FIG. 3B corresponds to interface substrate 300 of FIG. 3A being mounted onto a printed circuit board 390 by solder balls 315.

Figure 3C:
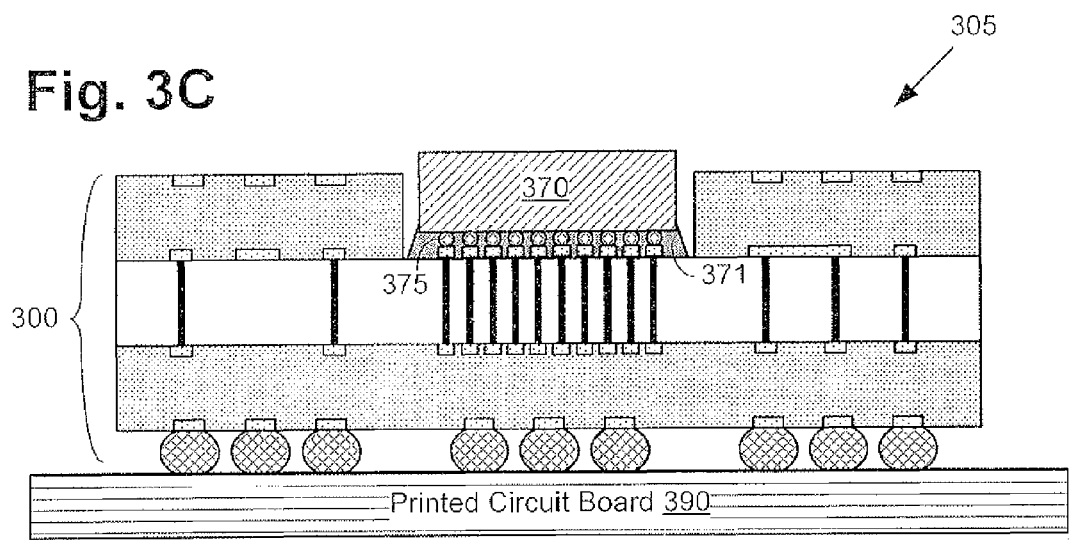
FIG. 3C presents a cross-sectional view of an exemplary package using an organic interface substrate with through-semiconductor vias.

FIG. 3C presents a cross-sectional view of an exemplary package using an organic interface substrate with through-semiconductor vias. Package 305 (or "semiconductor package" 305) of FIG. 3C includes interface substrate 300 and upper semiconductor device 370, and is mounted on printed circuit board 390. Upper semiconductor device 370 includes a plurality of microbumps 375, with an exemplary microbump 375 as shown. Underfill 371 is also placed below upper semiconductor device 370 to support and insulate the plurality of microbumps 375. With respect to FIG. 3C, interface substrate 300 may correspond to interface substrate 300 from FIG. 3B, as described above.

As previously discussed, the opening 301 may expose upper interconnect pads 338, which may also function as top contact pads for receiving upper semiconductor device 370, shown as a flip-chip in FIG. 3C. Similar to interface substrate 200, upper semiconductor device 370 may also include a wire-bonded die and/or multiple dies.

Figure 3D:
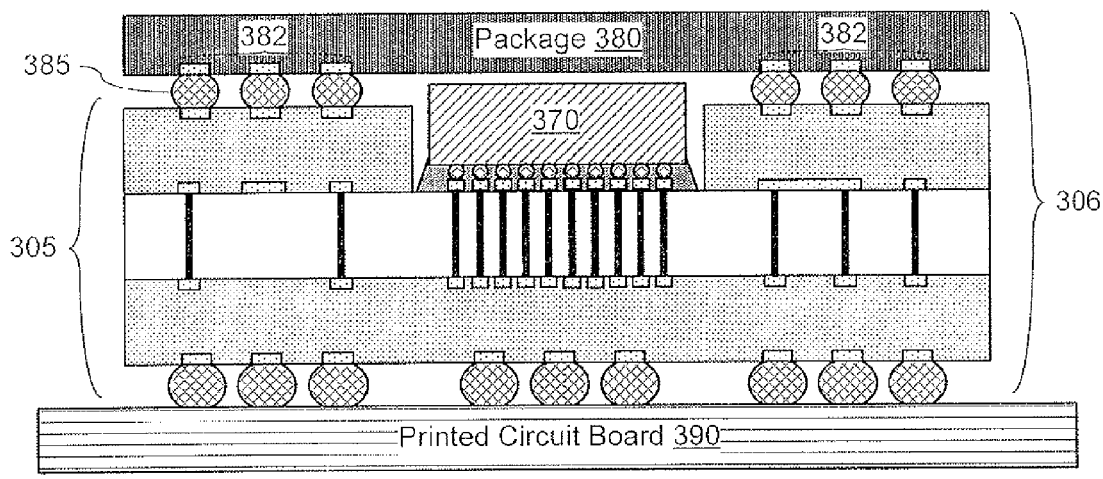
FIG. 3D presents a cross-sectional view of an exemplary package-on-package using an organic interface substrate with through-semiconductor vias.

Next, FIG. 3D presents a cross-sectional view of an exemplary package-on-package using an organic interface substrate with through-semiconductor vias. Package 306 (or "semiconductor package" 306) of FIG. 3D may correspond to package 305 of FIG. 3C with an addition of an upper package 380. Upper package 380 includes a plurality of solder balls 385, with an exemplary solder ball 385 as shown. Thus, a package-on-package solution may be provided, with package 305 as the lower package and upper package 380 as the upper package. Upper package 380 may be any type of package, including a multi-die package.

Advantageously, since the solder balls 385 may rest on an elevated surface provided by interface substrate 300, the size of solder balls 385 may be reduced while giving enough vertical clearance for package 380, enabling the use of smaller solder balls 385 for a reduced pitch size. Thus, the overall height of the package-on-package structure may be reduced. As with the previous package examples, package 306 may optionally include a heat-sink and mold compound, which is omitted from FIG. 3D.

Thus, as demonstrated by the above examples, the use of an interposer with through-semiconductor vias between an upper and lower organic substrate enables the continued use of low cost and widely deployed organic substrates while addressing the shortcomings of conventional organic substrate packages. The separation of the organic substrate into separate upper and lower substrates also enables the cost effective use of fabrication equipment. By providing an Opening in one of the organic substrates, one or more semiconductor dies may be attached to exposed interconnect pads coupled to through-semiconductor vias of the interposer, enabling the use of flip chips with high-density microbump arrays and the accommodation oldies with varied bump pitches. By providing the opening in the upper organic substrate, a package-on-package structure may also be provided.

From the above description it is manifest that various techniques can be used for implementing the concepts described in the present application without departing from the scope of those concepts. Moreover, while the concepts have been described with specific reference to certain implementations, a person or ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An interface substrate comprising:
an interposer having a first plurality of through-semiconductor vias (TSVs) for electrically connecting a first plurality of lower interconnect pads to a first plurality of upper interconnect pads;
a lower substrate having an opening, wherein the lower substrate is adjacent to the interposer;
a second plurality of lower interconnect pads for receiving a lower semiconductor die, wherein the second plurality of lower interconnect pads is capable of connection to a second plurality of upper interconnect pads, is within the opening, and is adjacent to the interposer.

2. The interface substrate of claim 1, wherein said interposer comprises silicon.

3. The interface substrate of claim 2, wherein said first plurality of TSVs are through-silicon vias.

4. The interface substrate of claim 1, wherein a pitch of said second plurality of lower interconnect pads is less than a pitch of said first plurality of upper interconnect pads.

5. The interface substrate of claim 1, further comprising a plurality of upper contact pads capable of connection to the first and second pluralities of upper interconnect pads, wherein a pitch of the second plurality of lower interconnect pads is less than a pitch of the plurality of upper contact pads.

6. The interface substrate of claim 1, further comprising an upper substrate having a plurality of upper contact pads, the upper substrate being adjacent to the interposer, wherein the plurality of upper contact pads is capable of receiving an upper semiconductor die and is capable of connection to the first and second pluralities of upper interconnect pads.

7. A semiconductor package comprising:
an interposer having a first plurality of through-semiconductor vias (TSVs) for electrically connecting a first plurality of lower interconnect pads to a first plurality of upper interconnect pads;
a lower substrate having an opening, wherein the lower substrate is adjacent to the interposer;
a second plurality of lower interconnect pads for receiving a lower semiconductor die, wherein the second plurality of lower interconnect pads is capable of connection to a second plurality of upper interconnect pads, is within the opening, and is adjacent to the interposer;
a plurality of upper contact pads capable of connection to the first and second pluralities of upper interconnect pads, the plurality of upper contact pads for receiving an upper semiconductor die.

8. The semiconductor package of claim 7, wherein said interposer comprises silicon.

9. The semiconductor package of claim 8, wherein said first plurality of TSVs are through-silicon vias.

10. The semiconductor package of claim 7, wherein a pitch of said second plurality of lower interconnect pads is less than a pitch of said first plurality of upper interconnect pads.

11. The semiconductor package of claim 7, wherein a pitch of the second plurality of lower interconnect pads is less than a pitch of the plurality of upper contact pads.

12. The semiconductor package of claim 7, wherein said upper semiconductor die is a flip-chip.

13. The semiconductor package of claim 7, wherein said lower semiconductor die is a flip-chip.

14. The semiconductor package of claim 7, further comprising an upper substrate adjacent to the interposer, wherein the upper substrate comprises the plurality of upper contact pads, the first plurality of upper interconnect pads, and the second plurality of upper interconnect pads.

* * * * *